United States Patent
Furukawa et al.

(10) Patent No.: US 6,210,866 B1
(45) Date of Patent: Apr. 3, 2001

(54) METHOD FOR FORMING FEATURES USING SELF-TRIMMING BY SELECTIVE ETCH AND DEVICE FORMED THEREBY

(75) Inventors: Toshiharu Furukawa, Essex Junction; Mark C. Hakey; Steven J. Holmes, both of Milton; David V. Horak, Essex Junction; Paul A. Rabidoux, Winooski, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/072,031

(22) Filed: May 4, 1998

(51) Int. Cl.$^7$ ....................................................... G03F 7/00
(52) U.S. Cl. ................................. 430/313; 430/317
(58) Field of Search .................... 430/313, 314, 430/316, 317, 323, 324, 5; 438/735, 738; 216/72

(56) References Cited

U.S. PATENT DOCUMENTS

| | | | | |
|---|---|---|---|---|
| 4,648,937 | * | 3/1987 | Ogura et al. | 156/643 |
| 4,997,746 | * | 3/1991 | Greco et al. | 430/314 |
| 5,208,124 | | 5/1993 | Sporon-Fiedler et al. | 430/5 |
| 5,214,603 | * | 5/1993 | Dhong et al. | 365/207 |
| 5,447,810 | | 9/1995 | Chen et al. | 430/5 |
| 5,472,814 | * | 12/1995 | Lin | 430/5 |
| 5,717,635 | * | 2/1998 | Akatsu | 365/185.05 |
| 5,861,330 | * | 1/1999 | Baker et al. | 438/232 |

FOREIGN PATENT DOCUMENTS

| | | |
|---|---|---|
| 92-100206 | 4/1992 | (JP) . |
| 96-76360 | 3/1996 | (JP) . |
| 96-130183 | 5/1996 | (JP) . |
| 96-279600 | 10/1996 | (JP) . |

\* cited by examiner

*Primary Examiner*—Kathleen Duda
(74) *Attorney, Agent, or Firm*—Schmeiser, Olsen & Watts; Eugene Shkurko

(57) ABSTRACT

The preferred embodiment provides a method for forming unlinked features when using image enhancement techniques. The preferred method is particularly applicable for use in hybrid resist lithographic processes. The method uses a trimming feature embedded in a substrate. The trimming feature acts as a block during a selective etch. This results in unlinked trenches being formed in the substrate. Thus, the preferred method creates unlinked, separate trenches from the "loops" formed by the hybrid resist or other image enhancement techniques. This allows the preferred method to form a plurality of unlinked features rather than the loops or linked features without requiring additional processing steps.

18 Claims, 22 Drawing Sheets

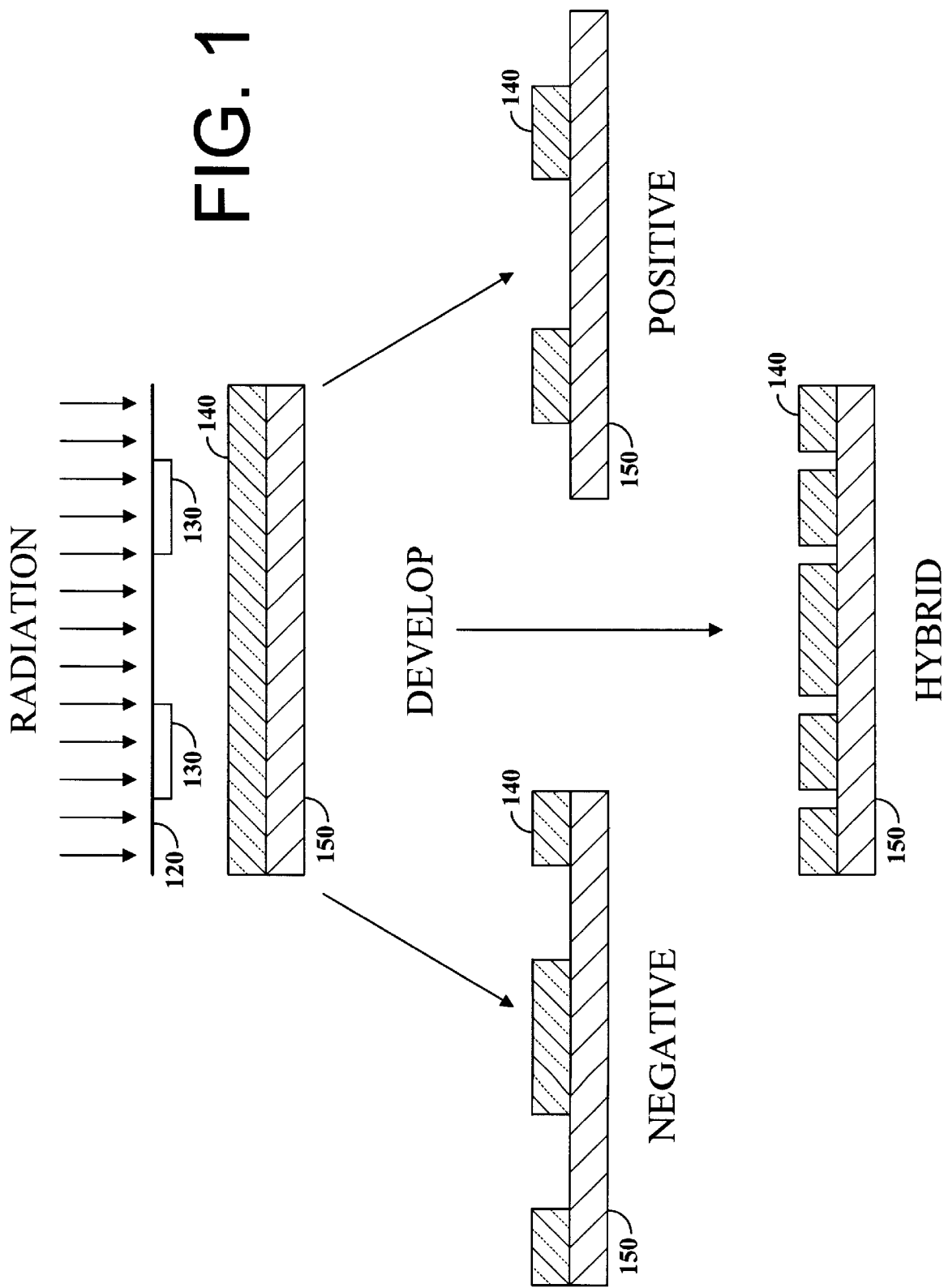

METHOD FOR FORMING FEATURES USING SELF-TRIMMING BY SELECTIVE ETCH AND DEVICE FORMED THEREBY

RELATED APPLICATIONS

This application is related to the following U.S. patent applications, Ser. No. 08/715,288, for "Low 'K' Factor Hybrid Photoresist," now allowed and Ser. No. 08/715,287, for "Frequency Doubling Hybrid Photoresist," now U.S. Pat. No. 6,114,082 both filed Sep. 16, 1996.

BACKGROUND OF THE INVENTION

1. Technical Field

The present invention relates generally to the field of semiconductor manufacturing and, more specifically, to a method for forming unlinked features.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

Many of the current technologies used to reduce the feature size inherently result in the creation of loops rather than unlinked, discrete feature lines. For example, image enhancing techniques such as phase shifting and sidewall image transfer create loops rather than discrete lines. To use these techniques to create unlinked features, further processing is required to segment the loops. This is typically done with an additional mask level used to pattern a trim shape over sections of the loop. A develop or etch process is then used to removed the undesired portions. These further processing steps required to segment the linked features introduces undesirable process complexity that increases the probability of defects in the final device.

Previously, a new frequency doubling hybrid photoresist was developed to extend photolithography to a smaller feature size. The hybrid resist uses the edges of the mask shapes to define the feature spaces in the resist. However, because the edge of the mask shape continues around the entire perimeter of the shape, these edge defined spaces are all linked together. Thus, like other image enhancing techniques, features created using hybrid resist are "linked" together. While this linking is acceptable in some situations, such as in the formation of shallow trench isolations, the linking can be unacceptable in other situations where the linking can cause unwanted shorting. Again, to overcome this, additional processing steps are required to trim the linked features.

The use of these additional processing steps to trim linked features in traditional photolithography or when using hybrid resist is undesirable for several reasons. First, the additional processing complexity increases the time and number of steps needed to form features. Second, the use of the additional mask levels increase the probability of overlay errors in the fabrication process.

For these reasons, what is needed is a method for forming unlinked features ing image enhancement techniques that do not unreasonably increase process complexity.

DISCLOSURE OF INVENTION

The present invention provides a method for forming unlinked features when sing image enhancement techniques. The preferred method is particularly applicable for use in hybrid resist lithographic processes. The method uses a trimming feature embedded in a substrate. The trimming feature acts as a block during a selective etch. This results in unlinked trenches being formed in the substrate. Thus, the preferred method creates unlinked, separate trenches from the "loops" formed by the hybrid resist or other image enhancement techniques. This allows the preferred method to form a plurality of unlinked features rather than the loops or linked features without requiring additional processing steps.

The present invention can be used in a wide variety of applications to provide a wide variety of features. For example, the present invention can be used to form the gates of Dynamic Random Access Memory (DRAM) cells.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and FIG. 1 is a schematic diagram showing the use of the hybrid resist;

BEST MODE FOR CARRYING OUT THE INVENTION

Figure 3:
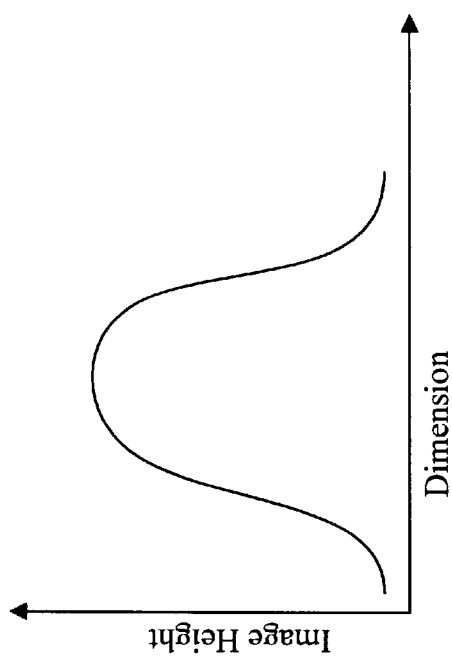
FIG. 3 is a graph illustrating the line pattern for positive resist printed with a reticle line pattern.

The present invention provides a method for forming unlinked features when using image enhancement techniques. The preferred method is particularly applicable for use in hybrid resist lithographic processes. The method uses a trimming feature embedded in the substrate. The trimming feature acts as a block during a selective etch. This results in unlinked trenches being formed in the substrate. Thus, the preferred method creates unlinked, separate trenches from the "loops" formed by the hybrid resist. This allows the method to form a plurality of unlinked features rather than the loops.

A description of hybrid photoresist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 $\mu$m and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
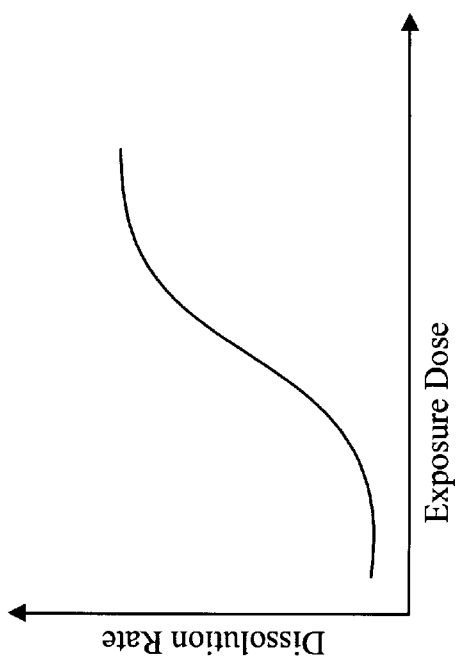
FIG. 2 is a graph illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
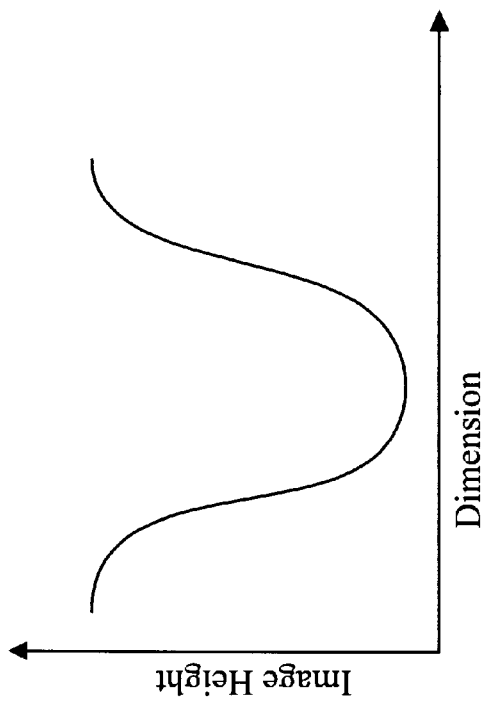
FIG. 5 is a graph illustrating the line pattern for negative resist printed with a reticle line pattern.
Figure 4:
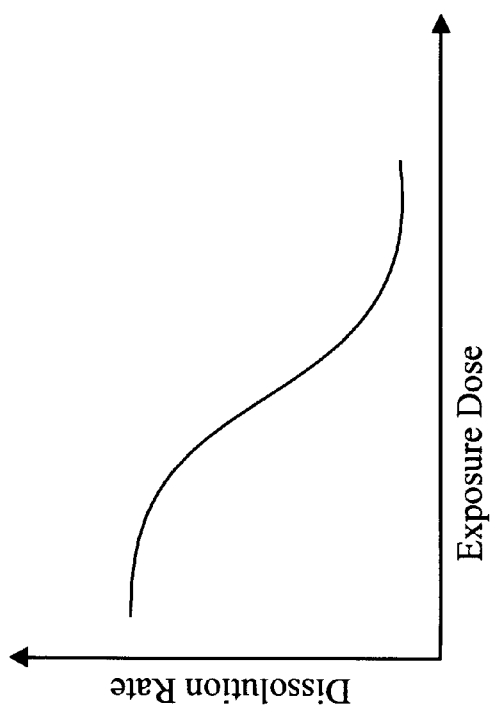
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
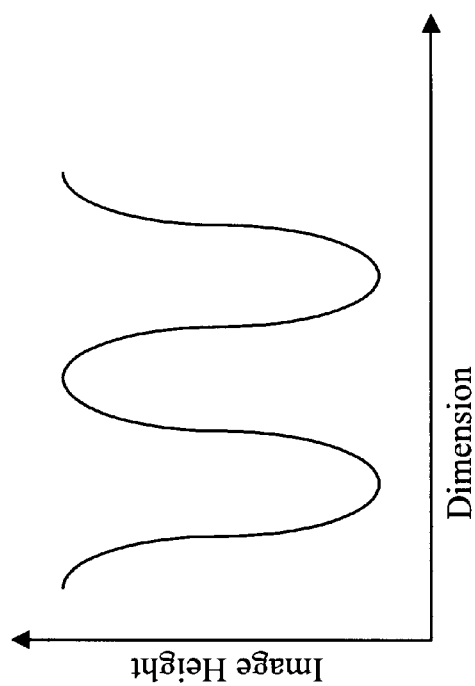
FIG. 7 is a graph illustrating the space/line/space pattern formed onto a substrate using hybrid resist.
Figure 6:
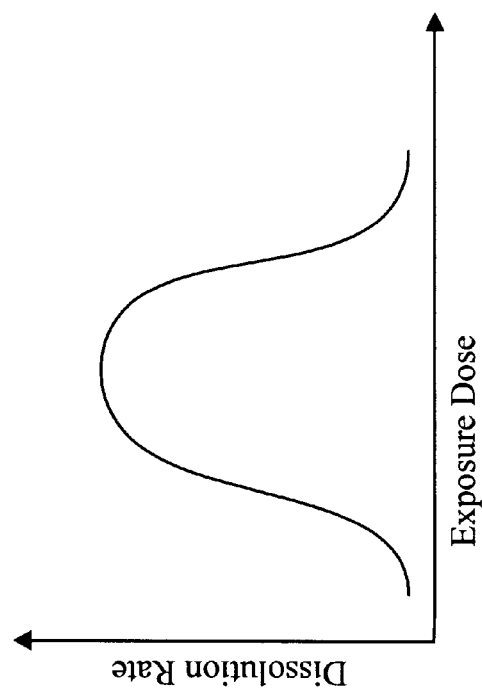
FIG. 6 is a graph of the resist solubility as a function of exposure dose for hybrid resist.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a hybrid photoresist 140 has been deposited over the surface of substrate 150. A mask 120 with chrome areas 130 is used to selectively mask portions of photoresist 140 from a radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
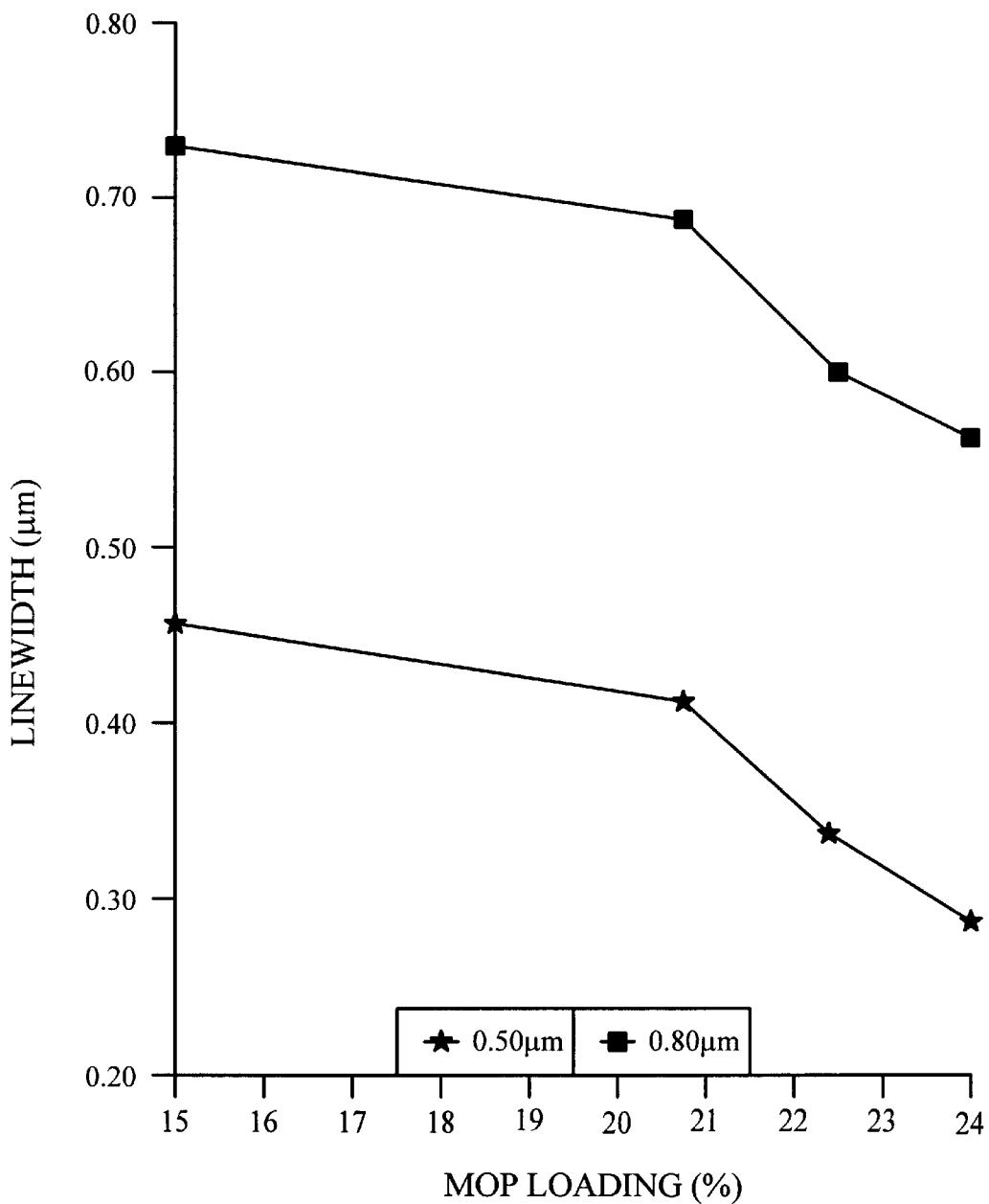
FIG. 10 is a graph showing the linewidth in nm plotted against the amount of positive tone solubility inhibitor (MOP) incorporated in a hybrid resist of the present invention.
Figure 15:
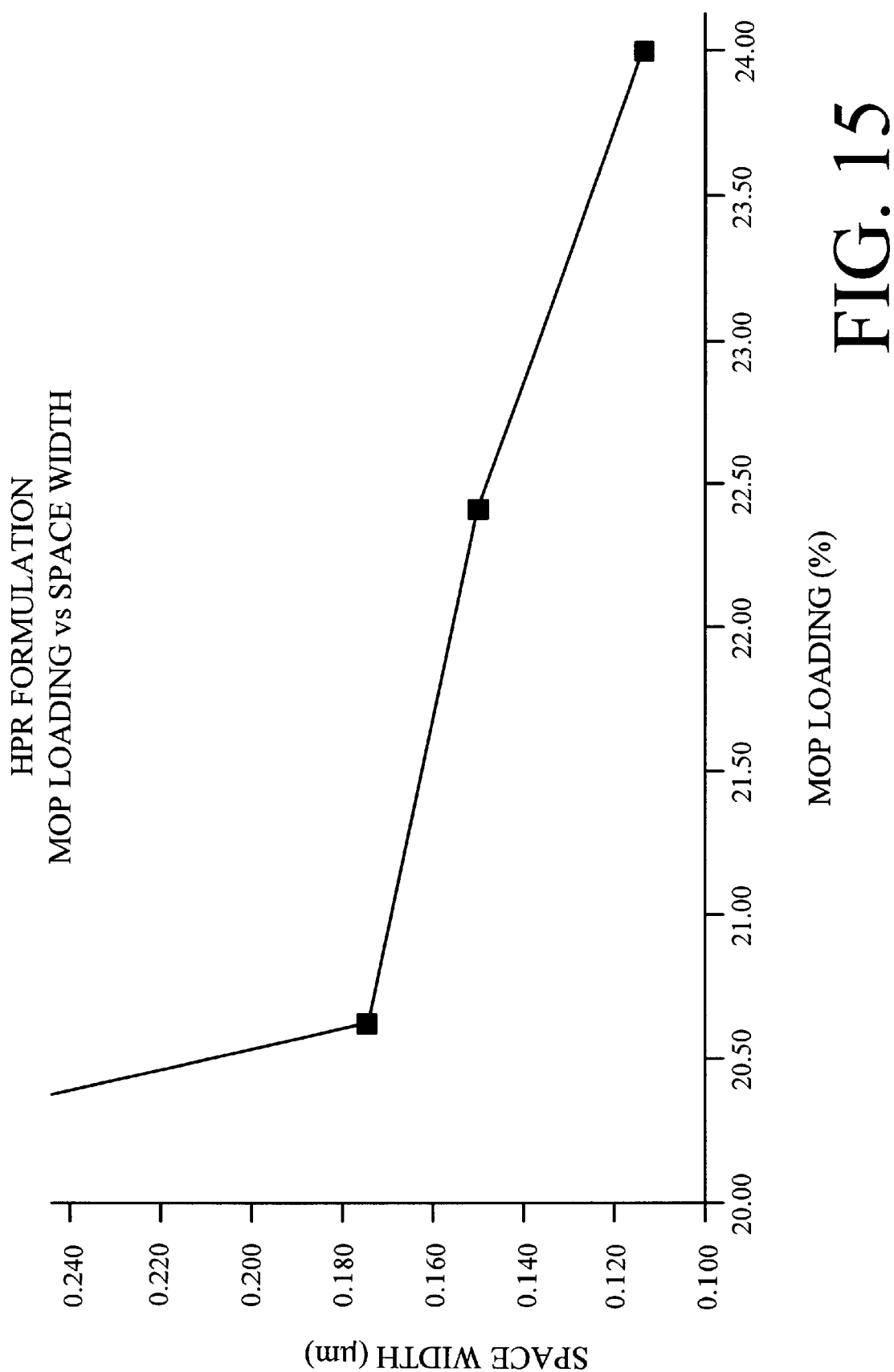
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
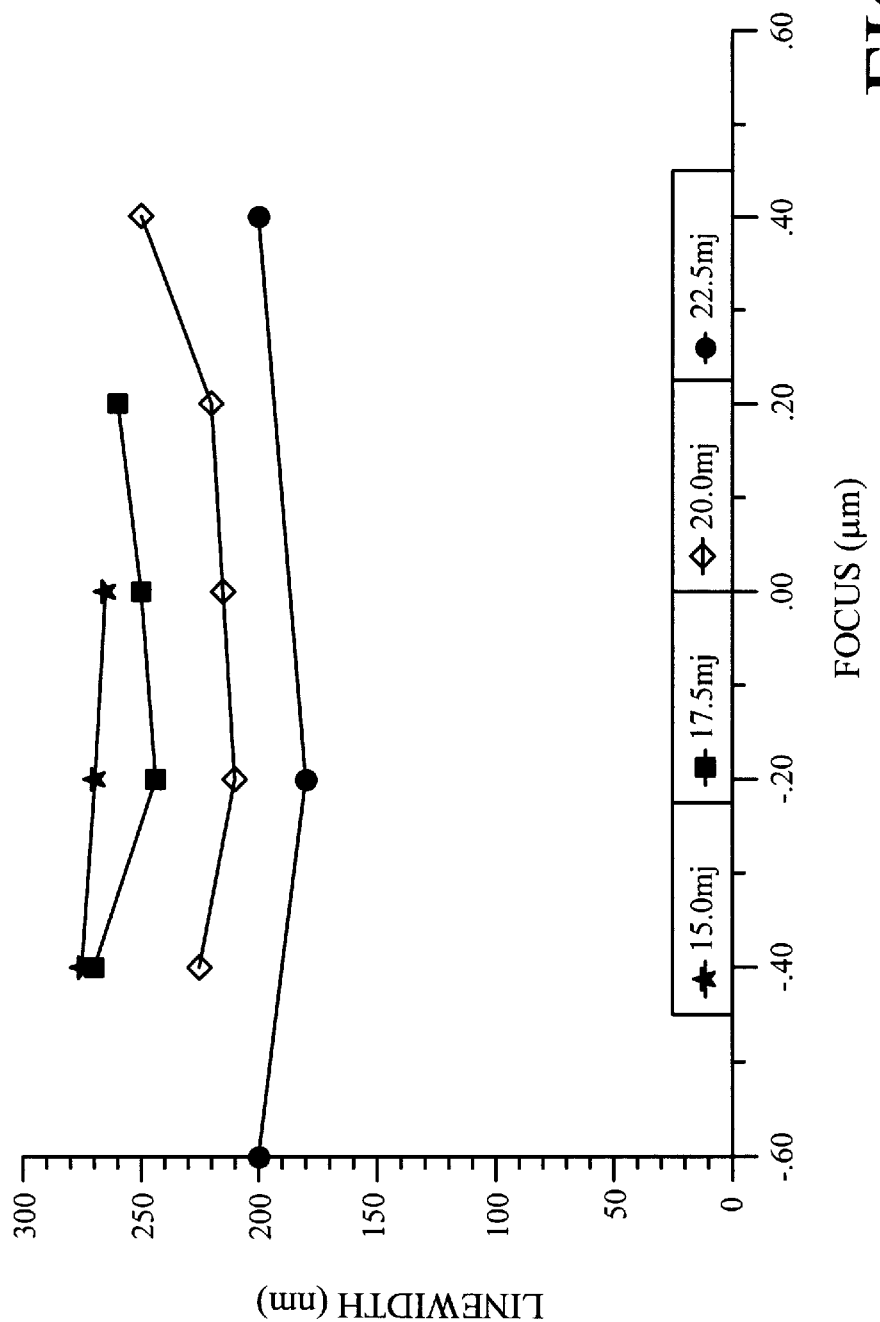
FIG. 8 is a graph of linewidth in nanometers (nm) plotted against focus in microns ($\mu$m) of a formulation of a standard negative resist at various exposure energies.
Figure 9:
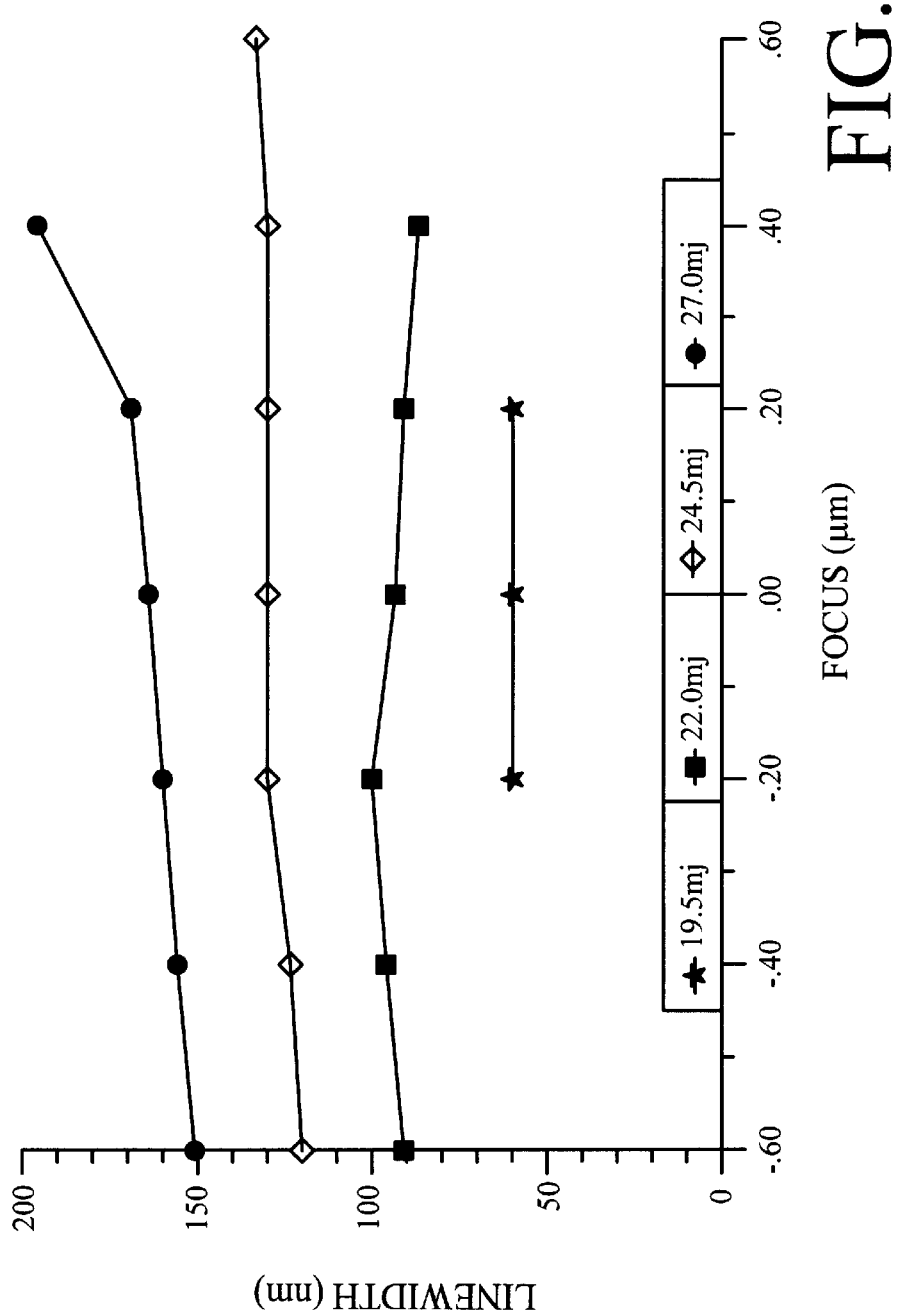
FIG. 9 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 8. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
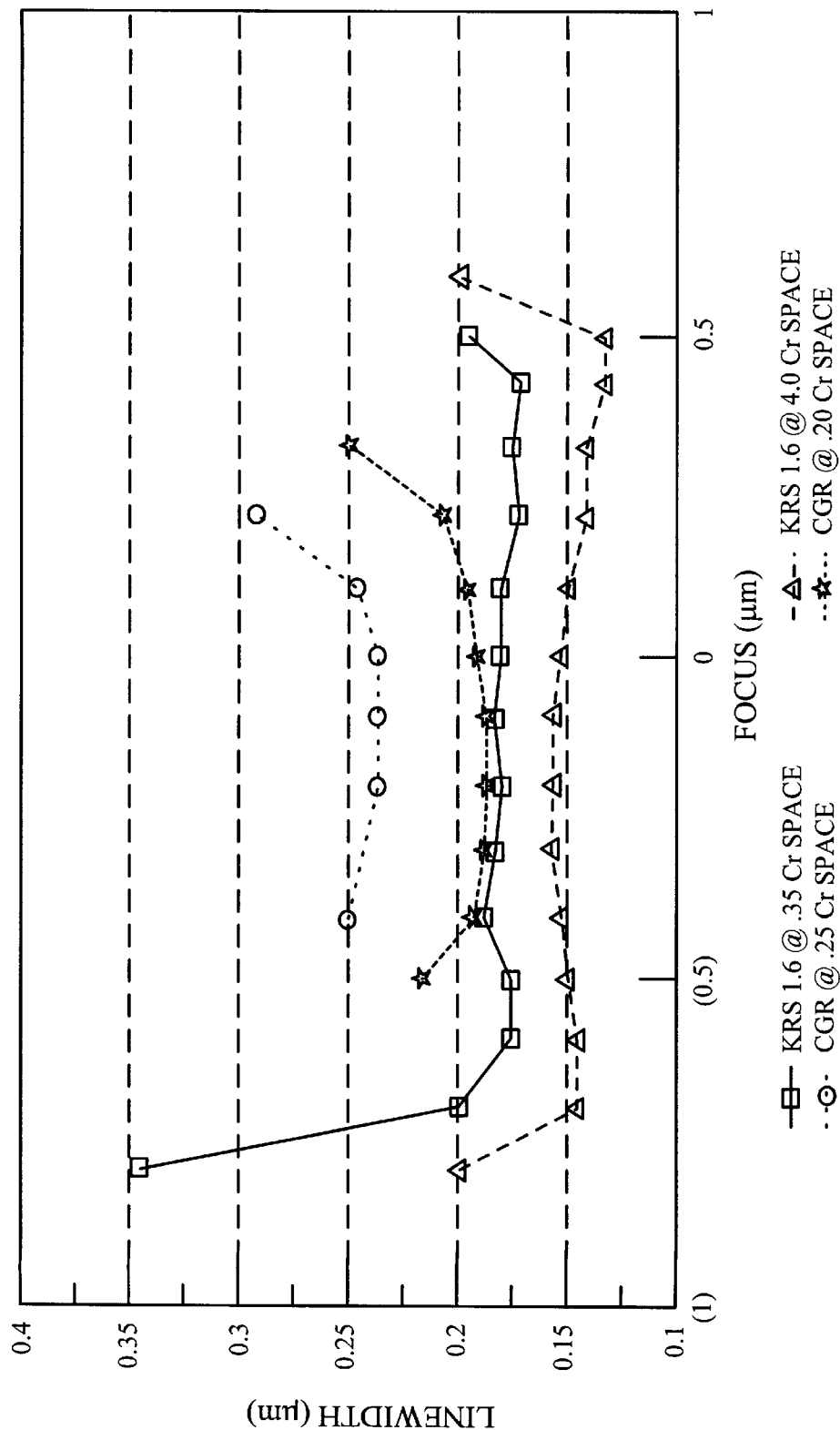
FIG. 11 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly(4-hydroxystyrene), poly(3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly(hydroxystyrene) subunits and vinyl cyclohexanol subunits preferably being in the range of about 99:1 to about 50:50. The most preferred ratio is about 90 poly(hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

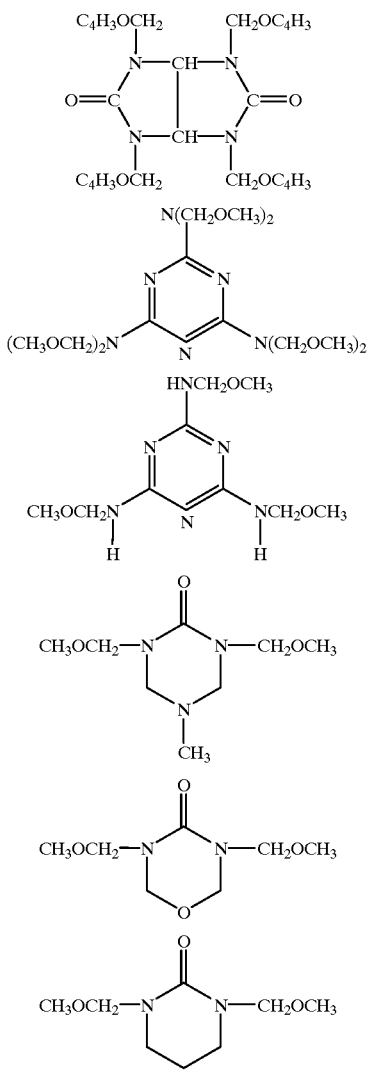

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

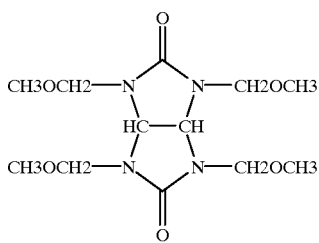

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propylene-glycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3- dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

The solution was filtered through a 0.2 $\mu$m filter. The solution was coated onto silicon wafers primed with hexamethyl-disilazane with a soft bake of 110° Celsius (C.) resulting in films of about 0.8 $\mu$m thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 millijoule (mJ) to about 3 mJ. Increasing the dose further, the negative cross-linking chemistry becomes predominant and the dissolution rate falls back to a value close to zero.

Figure 13:
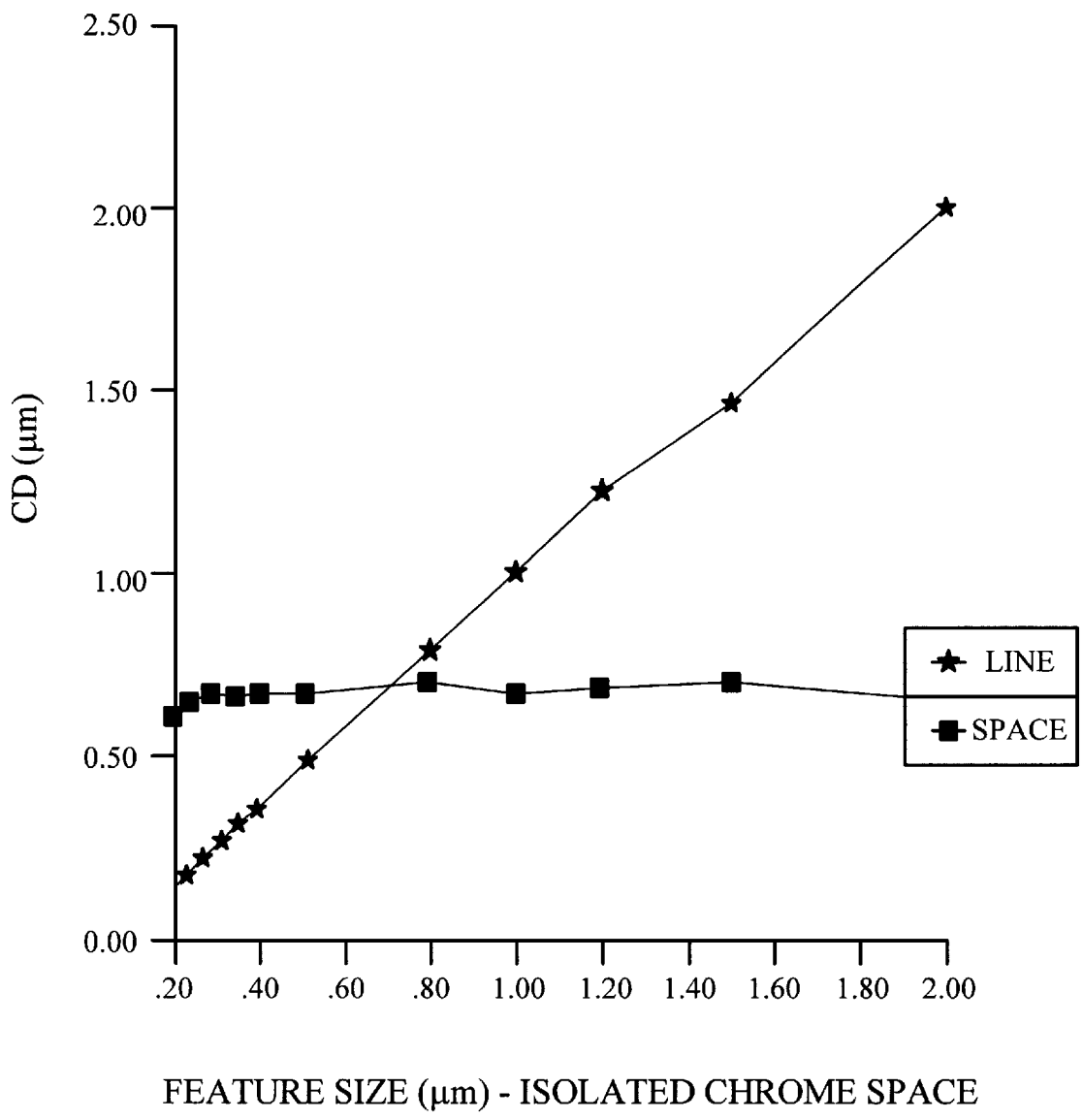
FIG. 13 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350 ppm FC-430 surfactant as a solvent to form a 18.9% solids solution.

Figure 12:
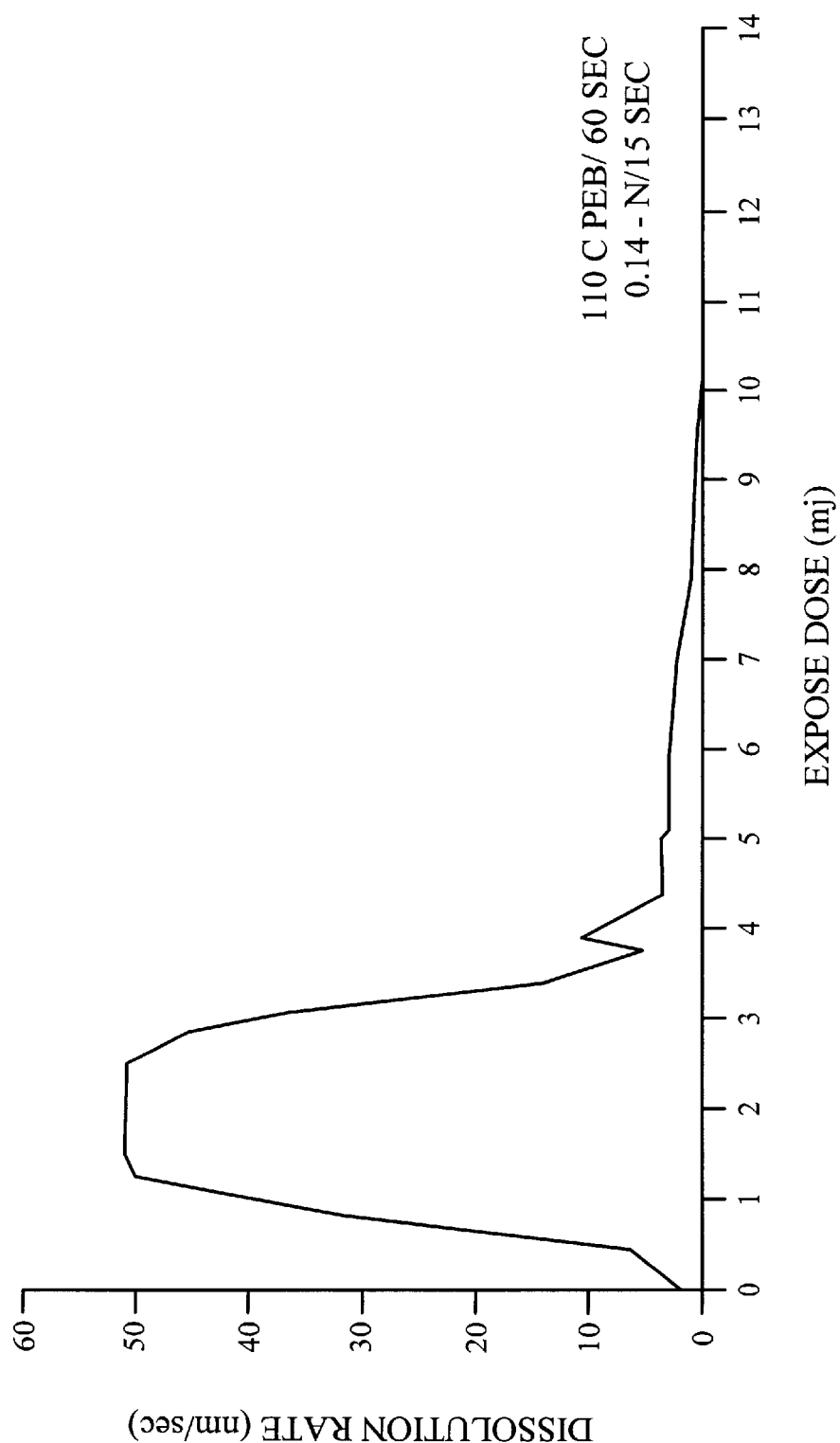
FIG. 12 is a graph showing the dissolution rate in nanometers per second (nm/sec) as a function of the exposure dose in millijoules (mJ) using one formulation of a hybrid resist of the present invention.
Figure 14:
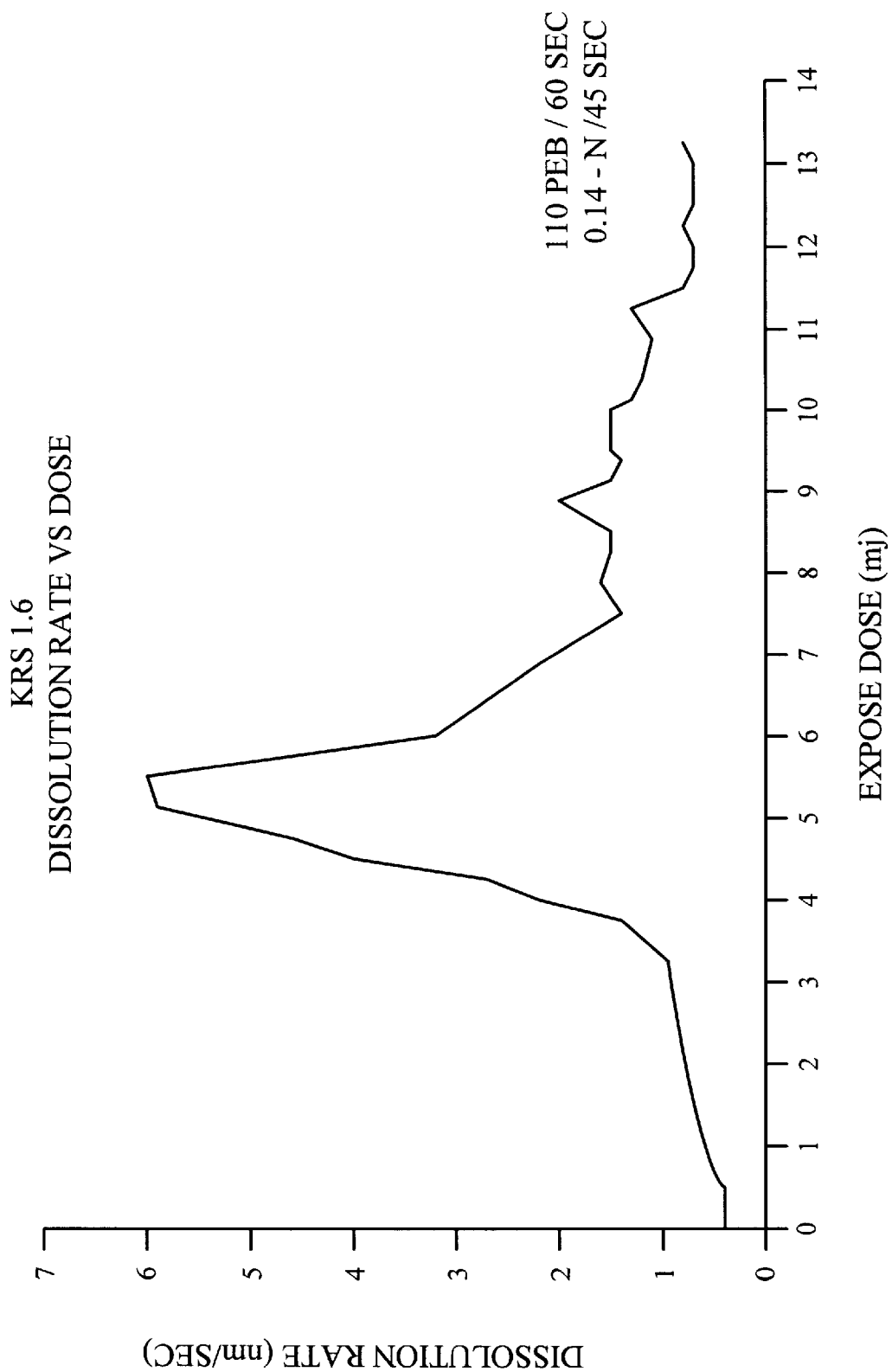
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
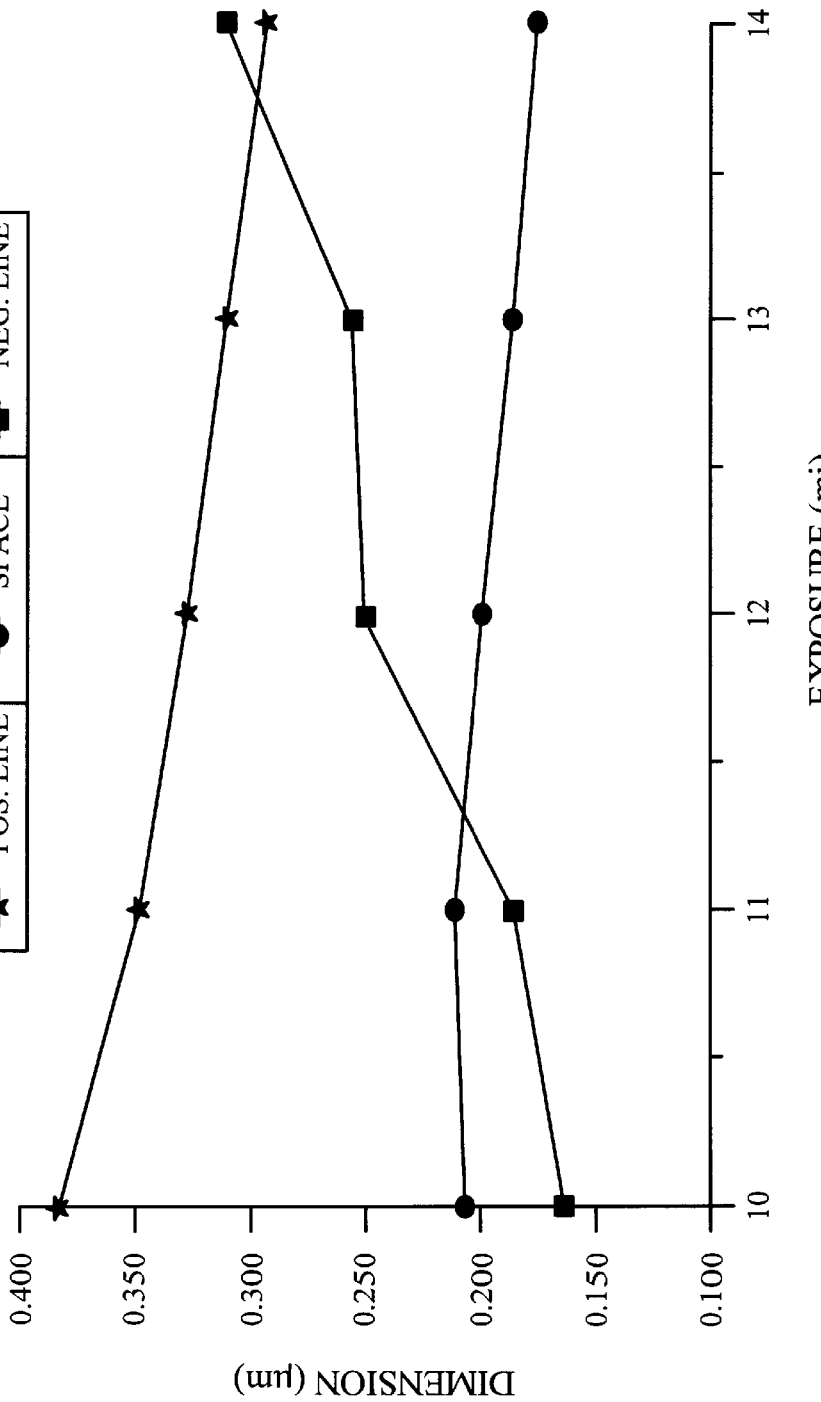
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 μm, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 μm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 $mJ/cm^2$, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 μm was observed for the hybrid resist relative to the standard negative resist, as calculated using standard methods known in the art.

Preferred Embodiments

The preferred embodiment of the present invention provides a method for self-trimming feature loops that are created as a result of image enhancement techniques. This allows image enhancement techniques to be used to create discrete feature lines rather than linked feature loops. Image enhancement techniques that result in linked feature loops that can be self-trimmed using the preferred embodiment include techniques such as phase shifting, sidewall image transfer, and hybrid resist lithography.

In particular, hybrid resist allows reduced feature size using traditional lithography techniques by using the edge of the mask shapes to define the feature spaces in the resist. However, because the edge of the mask shape continues around the entire perimeter of the shape, these edge defined spaces are all linked together. Thus, the same unique properties result in "linking" of the created features.

Figure 19:
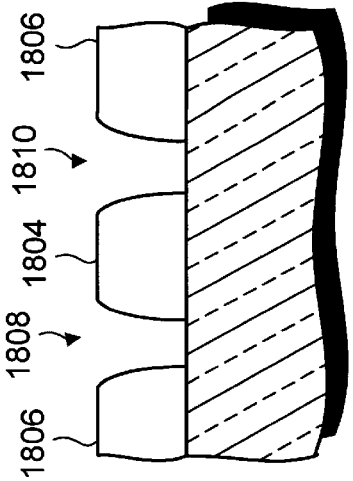
FIG. 19 is a cross-sectional side view of the wafer portion of FIG. 18 taken along line 19—19.
Figure 20:
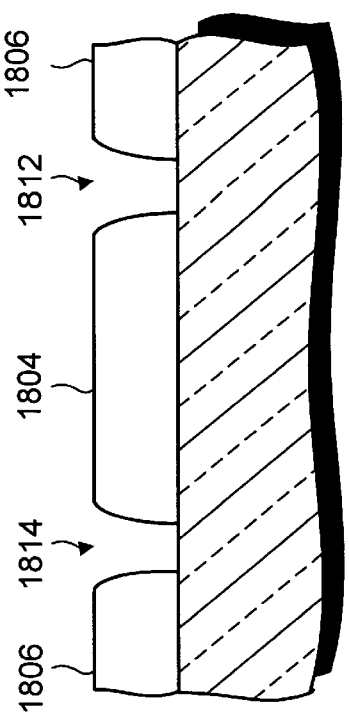
FIG. 20 is a cross-sectional side view of the wafer portion of FIG. 18 taken along line 20—20.
Figure 17:
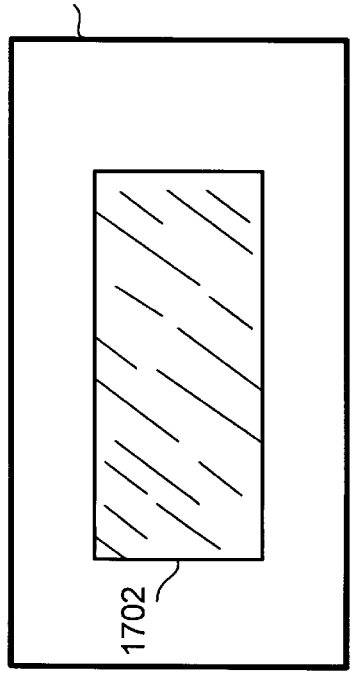
FIG. 17 is a schematic view of an exemplary mask portion.

The hybrid resist that is exposed to intermediate amounts of radiation becomes soluble. This occurs at the edges of the mask shapes, all around the perimeter of the mask shape. When developed, these regions wash away, and create "inked spaces" in the hybrid resist. For example, turning to FIG. 17, a mask 1700 containing a mask blocking shape 1702 is illustrated. When hybrid resist is deposited on a wafer, exposed through mask 1700 with actinic radiation, and developed, mask 1700 creates a linked pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
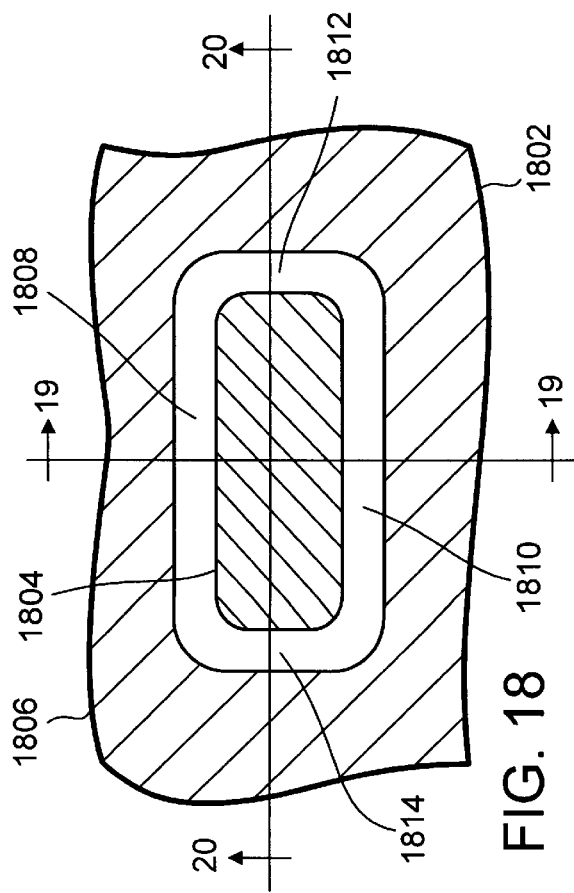
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain insoluble in the developer and form positive tone line patterns. Hybrid resist portions which are exposed with high intensity radiation (i.e., the outside region 1806 not blocked by mask shape 1702) form a negative tone line image. Hybrid resist portions which are exposed with intermediate amounts of intensity (i.e., the areas inside the edges of mask shape 1702) are dissolved during the development step and form feature spaces 1808 and 1810. This same process forms linking spaces 1812 and 1814 at the short edges of mask shape 1702. (In this application, the term "feature space" is defined as any space created by exposing hybrid resist to intermediate amounts of radiation by which a feature is to be created. By contrast, the term "linking space" is defined as any space created by the same process where no feature is desired such that feature spaces are linked together.) The feature spaces 1808 and 1810 can be used to form the desired features, for example, by depositing material in the spaces or by implanting into the wafer through the spaces. However, because of the linking spaces 1812 and 1814, these desired features will be connected together.

One advantage in using hybrid resist is that spaces 1808 and 1810 can be printed with a width of less than 0.2 μm with current deep ultra violet (DUV) lithography tools that are designed for operation at 0.35 μm resolution. Thus, by using the edge of a mask shape to define spaces in hybrid resist, smaller dimension features can be created than normal lithography allows. The linking of feature spaces 1808 and 1810, while desirable in some applications, such as isolation trench structures, is a problem for other types of features, such as gate conductors or wiring applications. For these applications the linking of spaces can result in unwanted shorting.

Figure 21:
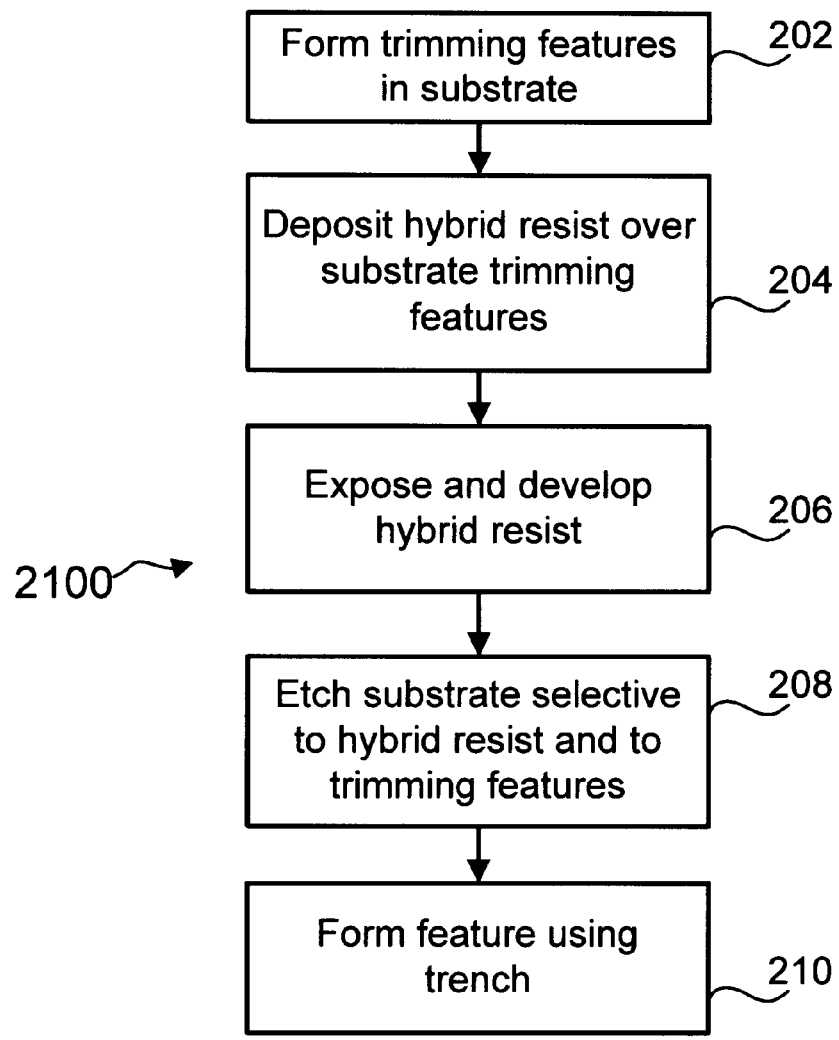
FIG. 21 is a flow diagram illustrating a first embodiment method.

The present invention provides several embodiments for eliminating the unwanted linking of features created by hybrid resist and other image enhancement techniques. Turning to FIG. 21, a preferred method 2100 is illustrated for forming unlinked features on a semiconductor substrate. The preferred method is described in the context of hybrid resist lithography, but those skilled in the art will recognize that it can be applied to other image enhancement techniques such as phase shifting and sidewall image transfer. Additionally, the preferred methods can be used in a variety of processing situations, and thus can be used to create a variety of types of features that will be found in CMOS, bipolar, and other semiconductor devices. As such, the preferred methods can be used on semiconductor wafers of various types and in various stages of the fabrication process.

The preferred method uses hybrid resist and trimming features formed in a substrate to create unlinked features in the semiconductor substrate. The first step 202 in method 2100 is to form trimming features in the substrate. These trimming features will be used, along with patterned hybrid resist to define unlinked features in the substrate. The trimming features preferably comprise a material which can serve as an etch block in a etch of the semiconductor substrate. As an example, the trimming features can comprise an oxide such as silicon dioxide or a nitride such as a silicon nitride. The trimming features can also comprise materials such as tungsten or aluminum. In particular, the trimming features of the preferred embodiment are selected to have differential etch characteristics when compared to the substrate, such that the substrate can be etched selective to the trimming features. To minimize processing complexity the trimming features are formed as part of another feature which is already needed in the semiconductor device. For example, the trimming features can comprise a portion of shallow trench isolation (STI) which is commonly used to isolate devices from one another. By using STI portions that are already being formed, process complexity is minimized. Of course, in some situations it may be desirable to form structures exclusively used as trimming features.

Figure 22:
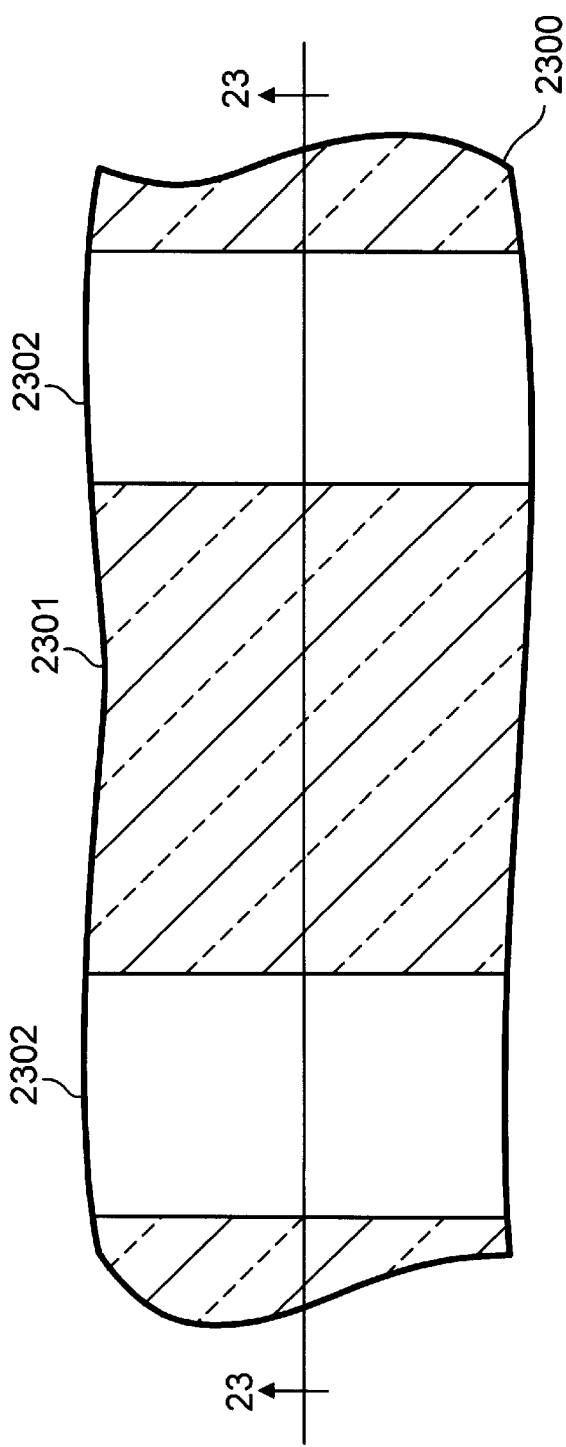
FIGS. 22 and 23 are schematic views of a wafer portion including trimming features.
Figure 23:
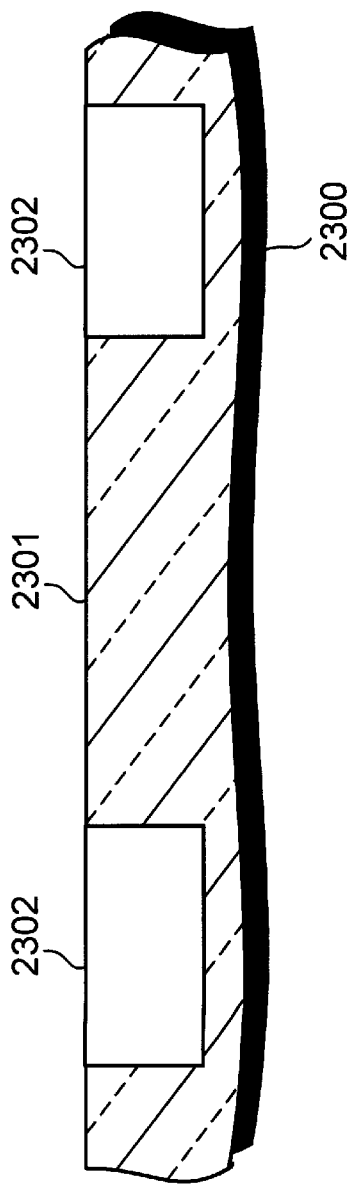

Turning to FIGS. 22 and 23, a wafer portion 2300 is illustrated, with FIG. 23 being a cross sectional view taken along line 23—23 of FIG. 22. The wafer portion 2300 illustrates one type of substrate which can be used in the preferred embodiments. The top portion of wafer portion 2300 comprises a substrate 2301 with two trimming features 2302 embedded into a substrate 2301. As discussed above, trimming features 2302 can comprise any suitable material which can be used as an etch block in later steps. As such, the trimming features 2302 can comprise features suitably formed in a semiconductor device, such as STI regions.

The next step 204 in method 2100 is to deposit hybrid resist on the semiconductor wafer. The hybrid resist can be any type of hybrid resist as discussed above. The next step 206 is to expose the hybrid resist to actinic radiation through a mask that contains at least one mask shape, perform a post exposure bake and develop the exposed hybrid resist. The post exposure bake is used to trigger the hybrid response in the hybrid resist, allowing regions of hybrid resist that have been exposed with intermediate amounts of intensity to be developed away. The post exposure bake also causes the negative tone areas to become fully cross linked and immune to development. Thus, hybrid resist portions which are unexposed (i.e., the areas under the blocking mask shape) remain insoluble in the developer and form positive tone line patterns. Hybrid resist portions which are exposed with high intensity radiation (i.e., the areas not under a mask shape) form a negative tone line image. Hybrid resist portions which are exposed with intermediate amounts of intensity (i.e., the areas under the edges of the blocking portion of the mask shape) are dissolved during the development step.

Figure 24:
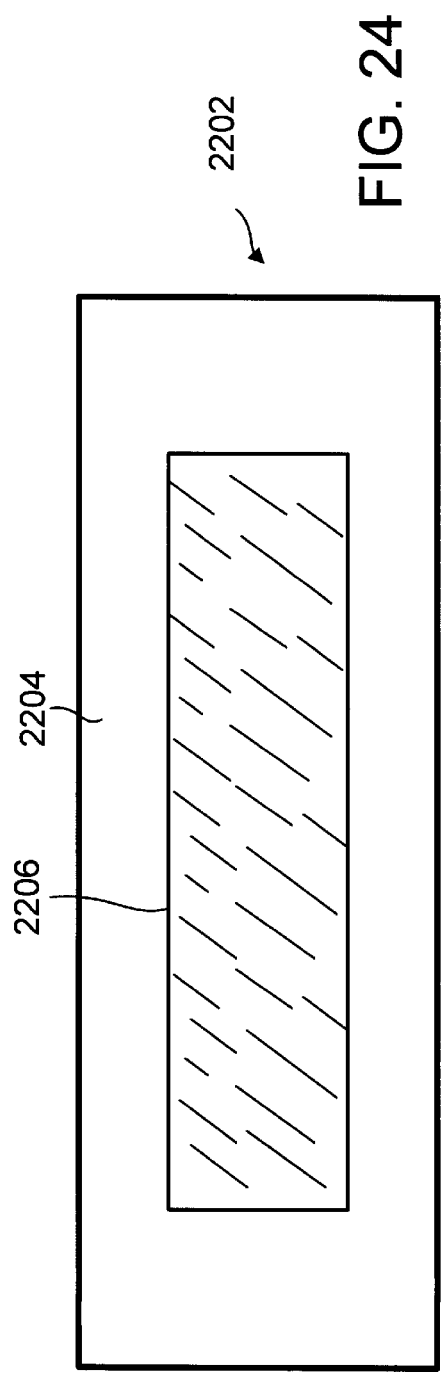
FIG. 24 is a schematic view of a mask portion.

Turning to FIG. 24, an exemplary mask portion 2202 is suitable for use in the preferred embodiment in step 204 is illustrated. The mask portion 2202 includes a transparent portion 2204 around the edge of mask portion 2202. The mask portion 2202 also includes a blocking portion 2206 (i.e., a portion that is not transparent to the actinic radiation used.)

Figure 25:
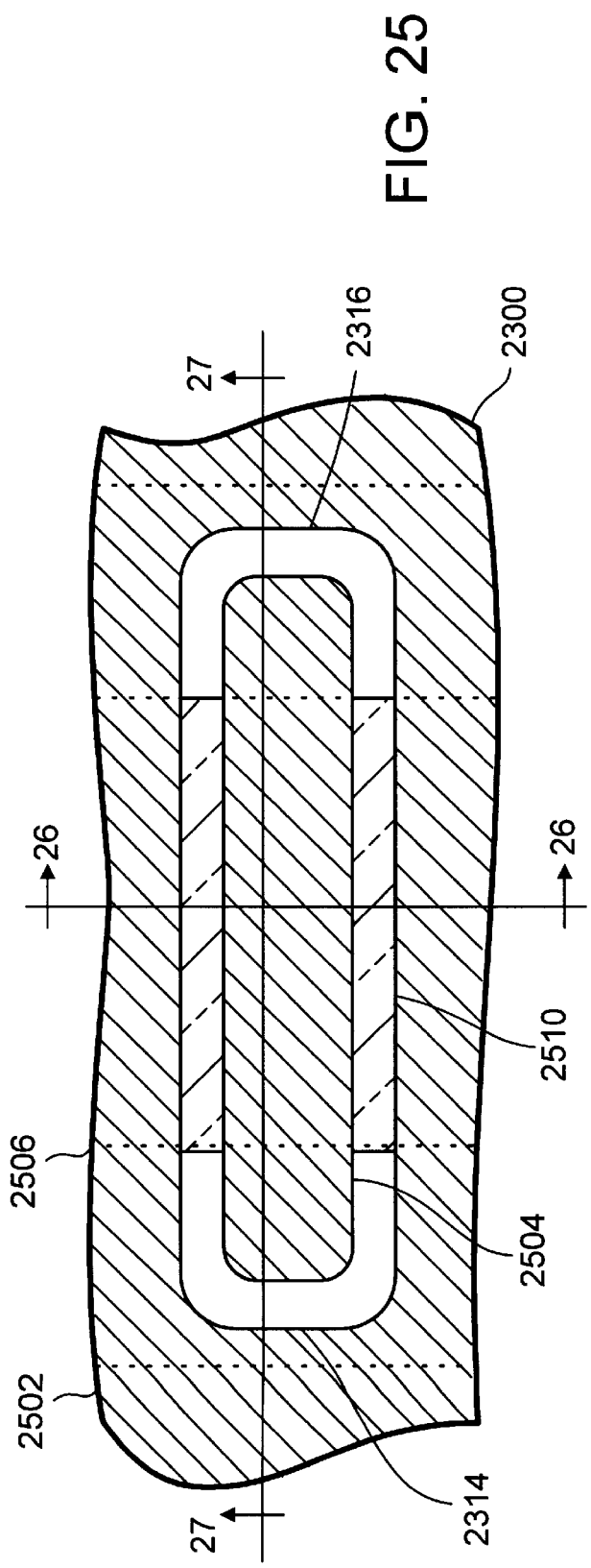
FIG. 25 is a schematic view of the wafer portion with patterned hybrid resist upon it in accordance with the preferred embodiment.
Figure 26:
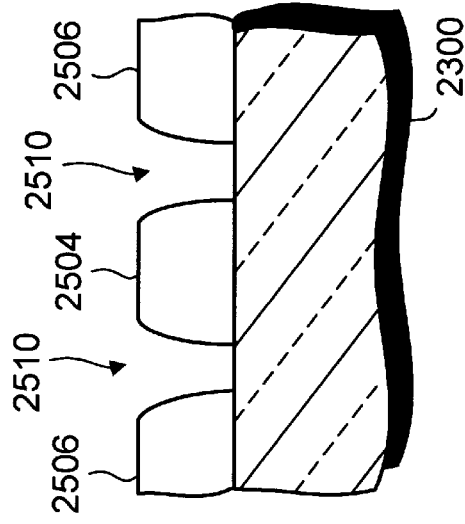
FIG. 26 is a cross-sectional side view of the wafer portion of FIG. 25 taken along line 26—26.
Figure 27:
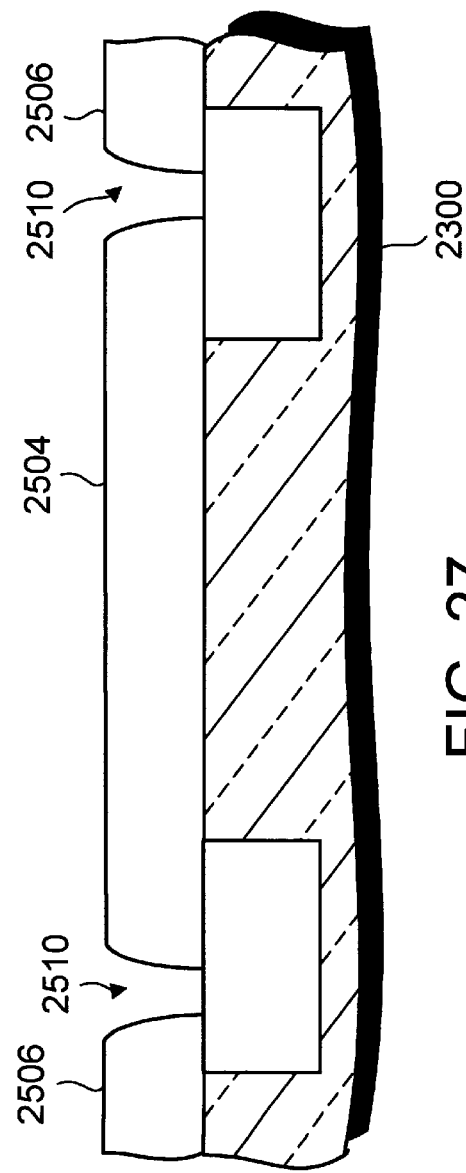
FIG. 27 is a cross-sectional side view of the wafer portion of FIG. 25 taken along line 27—27.

Turning to FIG. 25, wafer portion 2300 is illustrated with hybrid resist 2502 that has been deposited, exposed through the mask 2202 and developed. The wafer portion 2300 is also illustrated in FIG. 26, a cross sectional view taken along line 26—26 in FIG. 25, and in FIG. 27, a cross sectional view taken along line 27—27 in FIG. 23. Hybrid resist 2502 portions which are unexposed (i.e., the inside region 2504 blocked by mask shape 2206) remain insoluble in the developer and form positive tone line patterns. Hybrid resist portions which are exposed with high intensity radiation (i.e., the outside region 2506 not blocked by mask shape 2206 ) form a negative tone line image. Hybrid resist portions which are exposed with intermediate amounts of intensity (i.e., the areas inside the edges of blocking mask shape 2206) are dissolved during the development step. This forms the feature space 2510 in hybrid resist 2502 corresponding to the edge of the blocking mask shape 2206.

The feature space 2510 exposes the underlying wafer portion 2300. In particular, the feature space 2510 exposes a portion of the substrate 2301 and a portion of the trimming features 2302. It should be noted that because the feature space 2510 is formed using the unique properties of hybrid resist, it can be accurately formed at dimensions smaller than possible with traditional lithography.

It should be noted at this point that while the preferred embodiment is described as using hybrid resist to form the linked feature space, the preferred embodiment can also be used to trim linked features created by other image enhancement techniques such as sidewall image transfer and phase shifting.

Returning to FIG. 21, the next step 208 in method 2100 is to etch the substrate selective to the hybrid resist and the trimming features. Etching the substrate selective to the hybrid resist and the trimming features forms trenches in the substrate only where the hybrid spaces intersect with the substrate. Where the hybrid spaces intersect with the trimming features, no trench is formed because the etch is selective to the trimming features. Thus, the hybrid resist pattern is transferred to the substrate, but is not transferred into the trimming features. The looped space formed in the hybrid resist is thus patterned into the substrate as one or more unlinked trenches, which can then be used to form unlinked features at sub-critical dimensions.

Figure 28:
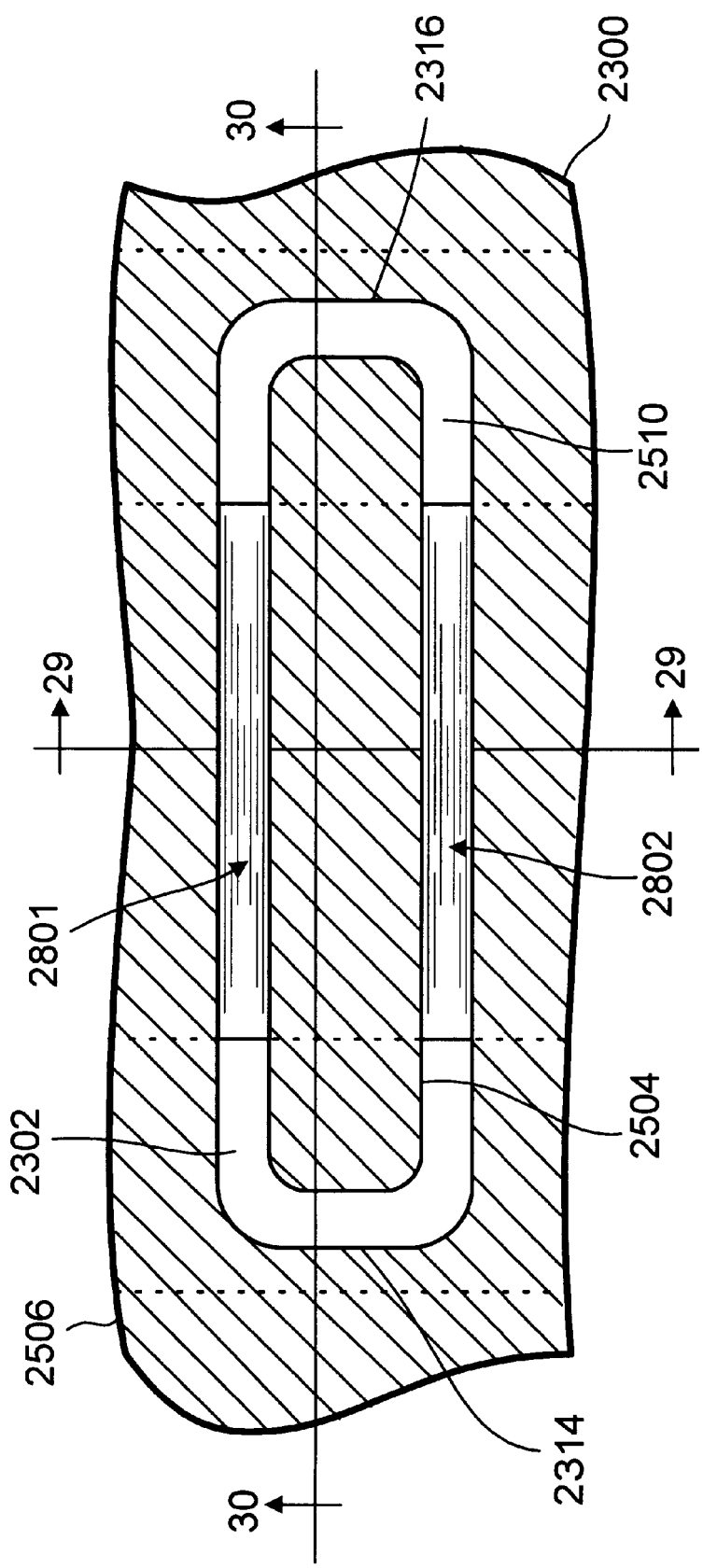
FIG. 28 is a schematic view of a wafer portion after feature trenches have been etched into the substrate
Figure 29:
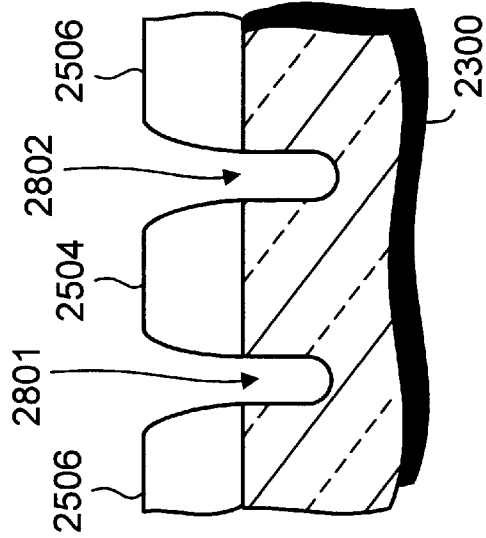
FIG. 29 is a cross-sectional side view of the wafer portion of FIG. 28 taken along line 29—29.
Figure 30:
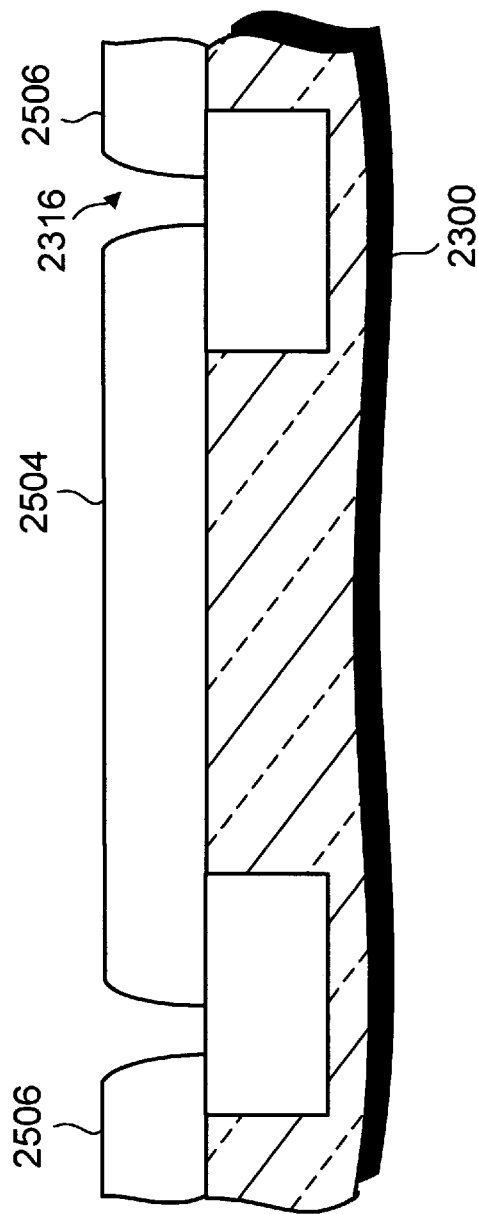
FIG. 30 is a cross-sectional side view of the wafer portion of FIG. 28 taken along line 30—30 with feature material deposited.

Turning to FIGS. 28, 29 and 30 (where FIG. 29 is a cross sectional view taken along line 29—29 and FIG. 30 is a cross sectional view taken along line 30—30 in FIG. 28), wafer portion 2300 is illustrated after the substrate 2301 has been etched selective to hybrid resist and the trimming feature material. The etch has formed two trenches 2801 and 2802 in the substrate 2301. These trenches are formed where the substrate 2301 was exposed through the hybrid resist spaces 2510. Because the etch was selective to the trimming features 2302 material, a trench is not formed there. The trenches 2801 and 2802, because they were defined using the hybrid resist, are able to be accurately formed at smaller dimensions than is possible using conventional methods.

The next step 210 is to form a feature on the wafer portion using the formed trenches. This step can comprise any type of processing in or through the trenches in the substrate. For example, an implant can be made through the trenches, a new feature material can be deposited into the trenches, the underlying substrate can be etched through the trenches, or a combination of any of these or other fabrication processes may be performed. As an example in DRAM fabrication, future processing can include the growing of sacrificial oxide followed by a cleaning step to give a uniform surface. Gate oxide is then grown and polysilicon gate material is deposited in the feature trench and polished.

Figure 31:
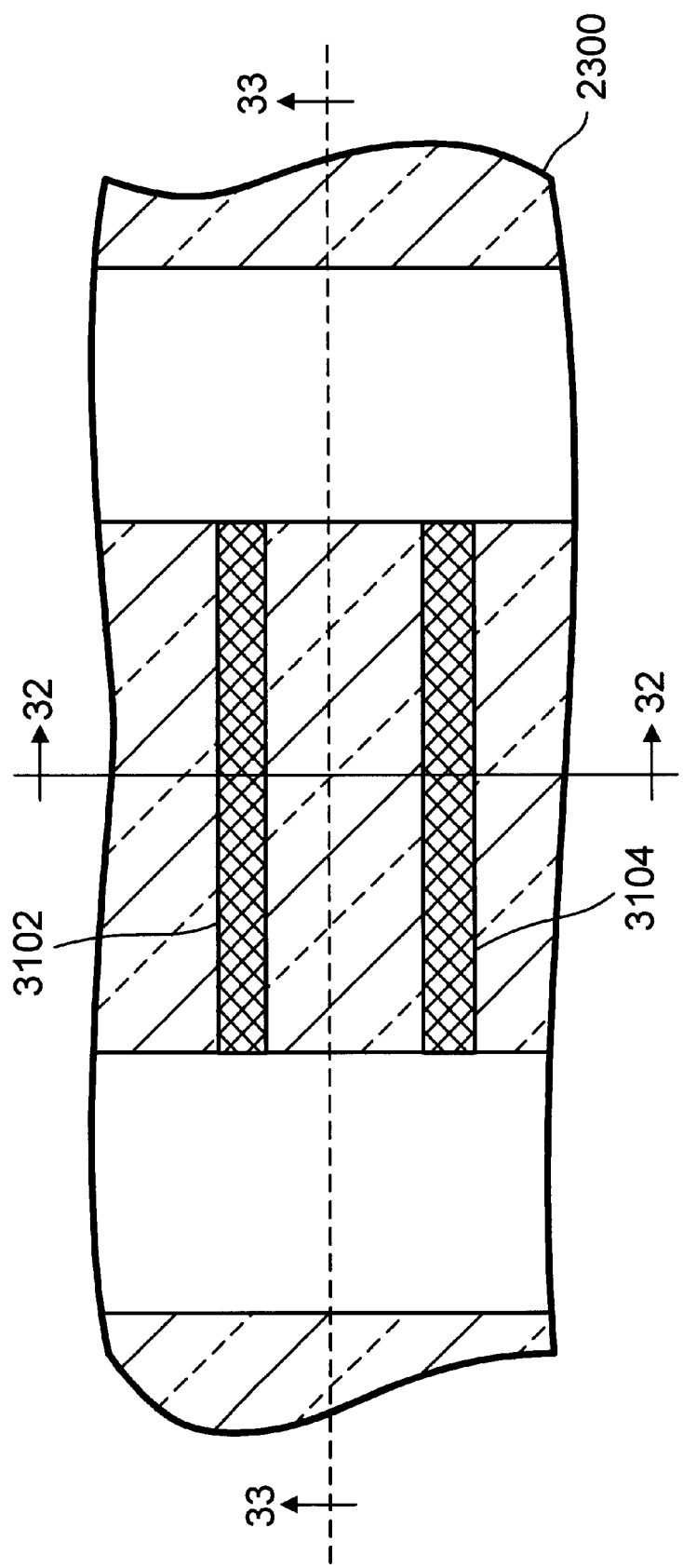
FIG. 31 is a top schematic view of a wafer portion after feature material has been deposited and the hybrid resist removed in accordance with the preferred embodiment.
Figure 32:
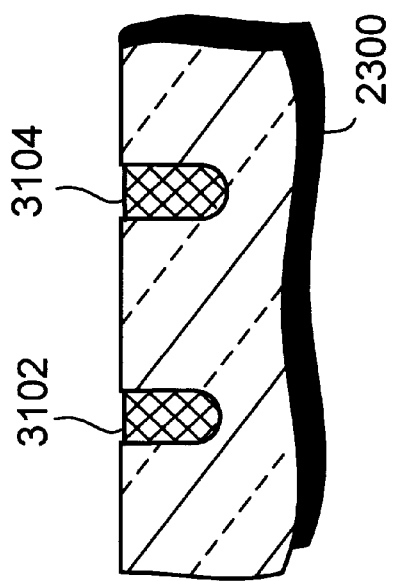
FIG. 32 is a cross-sectional side view of the wafer portion of FIG. 31 taken along line 32—32.
Figure 33:
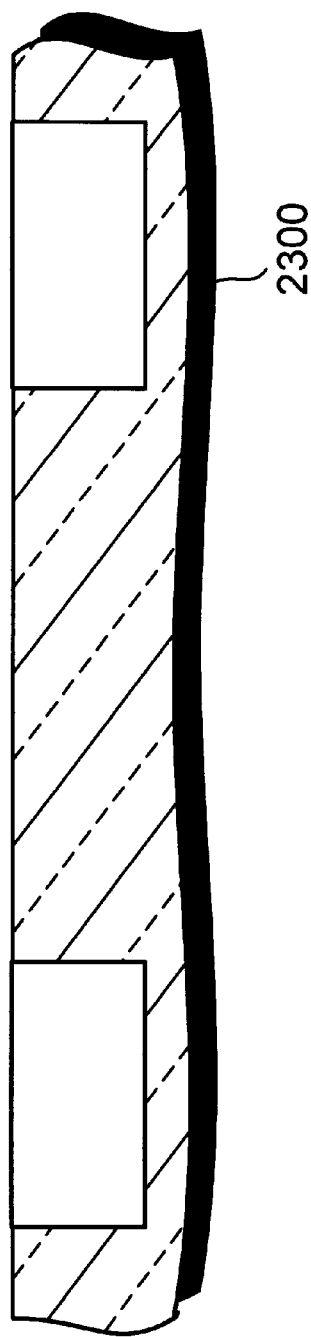
FIG. 33 is a cross-sectional side view of the wafer portion of FIG. 31 taken along line 33–33.

Turning to FIGS. 31, 32 and 33 (where FIG. 32 is a cross sectional view taken along line 32—32 and FIG. 33 is a cross sectional view taken along line 33—33 in FIG. 31), wafer portion 2300 is illustrated after feature material has been deposited to fill trenches 2801 and 2802, and the wafer portion was etched to remove feature material and hybrid resist portions, leaving embedded unlinked features 3102 and 3104 in trenches 2801 and 2802 respectively.

The unlinked features 3102 and 3104 are representative of the many types of features that can be formed using the preferred embodiment methods. Thus, the preferred embodiment allows hybrid resist to create features of sub-critical dimension, using the edge of mask shapes to define the pattern in hybrid resist, without any linking between these features.

It should be noted that for some applications the substrate in which the unlinked features are formed preferably comprises a sacrificial sub-layer such as silicon dioxide or another dielectric, or suitable polymers. The hybrid is deposited on the sub-layer, exposed and developed. The image is then etched into the sub-layer. This patterns the feature spaces and trim spaces into the sub-layer. The hybrid resist is then stripped, and feature material is conformally deposited across the patterned sub-layer, and etched until it only remains in the trenches. The sub-layer itself is then etched away, leaving only the unlinked features. In other embodiments, the trimming features can be removed in this step.

It should also be noted that the preferred trim methods do not require that the features be trimmed only at their ends. Additionally, a single "loop" could be broken into many different features by using many different trimming features.

Thus, the preferred embodiments provide a method for forming unlinked features using hybrid resist. This allows hybrid resist, with its associated ability to create features with sub-critical dimensions using current lithographic equipment, to be used in a greater variety of applications.

The preferred trimming methods can be applied to facilitate the use of hybrid resist in a wide variety of applications. One of these applications is the fabrication of dynamic random access memory chips or DRAM chips. DRAM chips are used extensively in computer applications where large amounts of inexpensive yet relatively high performance memory is needed. As more advanced applications are developed, an increasingly large amount of DRAM is needed. This has driven an ever increasing need for greater device densities and economical ways of producing these devices. The preferred embodiment can be used to form field effect transistor gates in DRAM devices at higher densities than traditional methods provide. For more information on how the preferred embodiment can be used to form DRAM devices, see "High Performance MOSFET Device with Raised Source and Drain", Ser. No. 09/024,840, Docket No. BU9-97-136, filed on Feb. 17, 1998, now U.S. Pat. No. 5,998,835.

While the invention has been particularly shown and described with reference to an exemplary embodiment using hybrid resist, those skilled in the art will recognize that the preferred trim process can be used to form any type of unlinked edge defined feature, and that various changes in form and details may be made therein without departing from the spirit and scope of the invention. For example, it will also be understood by those skilled in the art that the invention is applicable to different isolation technologies (e.g., LOCOS, recessed oxide (ROX), STI, etc.), well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A method for forming a feature on a substrate having a top surface, the method comprising the steps of:
   a) forming a trimming feature having a top surface in said substrate, said trimming feature top surface substantially coplaner with the substrate top surface;
   b) depositing a photoresist on said substrate top surface and said trimming feature top surface;
   c) patterning said photoresist, said patterning of said photoresist exposing a portion of the trimming feature top surface and a portion of the substrate top surface, said patterning the photoresist forming a linked pattern in the photoresist;
   d) etching said substrate top surface selective to said patterned photoresist and said trimming feature, said etching forming a discrete pattern in said substrate; and
   e) forming a feature using said discrete pattern in said substrate.

2. The method of claim 1 wherein the step of patterning the photoresist uses image enhancement techniques that result in forming a linked pattern in the photoresist.

3. The method of claim 2 wherein the image enhancement technique comprises sidewall image transfer.

4. The method of claim 2 wherein the image enhancement technique comprises phase shifting lithography.

5. The method of claim 1 wherein the photoresist comprises hybrid photoresist.

6. The method of claim 5 wherein the step of patterning the hybrid photoresist comprises exposing the hybrid photoresist through a mask comprising mask shapes having edges, such that areas of the hybrid photoresist under the edges of said mask shapes are exposed to intermediate amounts of exposure.

7. The method of claim 1 wherein the trimming feature comprises silicon dioxide isolation features.

8. The method of claim 1 wherein the trimming feature comprises shallow trench isolation regions.

9. The method of claim 1 wherein the step of forming a feature using said pattern in said substrate comprises forming a gate conductor in said pattern.

10. The method of claim 1 wherein the substrate comprises a semiconductor substrate.

11. The method of claim 1 wherein the substrate comprises a sacrificial sub-layer substrate.

12. A method for forming a feature on a substrate, the method comprising the steps of:
   a) forming a trimming feature in said substrate;
   b) depositing a hybrid resist on said substrate and said trimming feature;
   c) exposing said hybrid resist through at least one mask containing a plurality of feature shapes having edges, wherein regions of hybrid resist under the edges of said feature shapes are exposed to intermediate amounts of exposure, wherein said intermediate amounts of exposure results from diffraction effects at the edges of said plurality of feature shapes;

d) developing said hybrid resist such that portions of said hybrid resist that were exposed to intermediate amounts of exposure are removed, forming a plurality of linked spaces, said plurality of linked spaces exposing at least a portion of said substrate and a portion of said trimming feature;

e) etching said exposed portion of said substrate selective to remaining hybrid resist and said exposed portion of said trimming feature, said etching forming at least one discrete feature trench in said exposed portion of said substrate; and f) forming a feature using said at least one discrete feature trench.

13. The method of claim 12 wherein said substrate comprises a semiconductor wafer and wherein said trimming feature comprises isolation regions embedded in said semiconductor wafer.

14. The method of claim 12 wherein the substrate comprises a sacrificial sub-layer.

15. The method of claim 12 wherein the step of forming a feature with said feature trench comprises growing a gate oxide in said feature trench and depositing a gate conductor material in siad feature trench on said gate oxide.

16. A method for forming a dynamic random access memory (DRAM) device comprising the steps of:

a) providing a semiconductor substrate;

b) forming isolation structures embedded in said semiconductor substrate c) depositing a layer of hybrid resist on a semiconductor substrate and said isolation structures;

d) exposing said layer of hybrid resist through a mask having a plurality of shapes defining gate conductor regions such that areas of said layer of hybrid resist under edges of said gate conductor defining shapes are exposed to intermediate amounts of exposure, wherein said intermediate amount of exposure results from diffraction effects at the edges of said plurality of gate conductor defining shapes;

e) developing said layer of hybrid resist, such that areas of said layer of hybrid resist exposed to intermediate amounts of exposure are developed away, said developing exposing a portion of said semiconductor substrate and a portion of said isolation structures;

f) etching said exposed portion of said semiconductor substrate selective to said hybrid resist and said exposed portion of said isolation structures, said etching forming a feature trench in said semiconductor substrate extending between isolation structures;

g) forming a feature in said feature trench.

17. The method of claim 16 wherein the isolation structures comprise shallow trench isolation comprising silicon dioxide.

18. The method of claim 16 wherein the step of forming a feature in said feature trench comprises growing gate oxide in said feature trench and depositing gate conductor material in said feature trench.

* * * * *